United States Patent
Paul (10) Patent No.: US 9,804,247 B2
(45) Date of Patent: Oct. 31, 2017

(54) METHOD AND MAGNETIC RESONANCE SYSTEM TO ACQUIRE MR DATA OF A SLICE OF A VOLUME SEGMENT WITHIN AN EXAMINATION SUBJECT

(71) Applicant: Siemens Aktiengesellschaft, Munich (DE)

(72) Inventor: Dominik Paul, Bubenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 529 days.

(21) Appl. No.: 14/541,407

(22) Filed: Nov. 14, 2014

(65) Prior Publication Data

US 2015/0130462 A1    May 14, 2015

(30) Foreign Application Priority Data

Nov. 14, 2013 (DE) .................. 10 2013 223 191

(51) Int. Cl.
*G01R 33/565* (2006.01)
*G01R 33/483* (2006.01)
*G01R 33/561* (2006.01)

(52) U.S. Cl.
CPC ... *G01R 33/56536* (2013.01); *G01R 33/4833* (2013.01); *G01R 33/5617* (2013.01)

(58) Field of Classification Search
CPC .......... G01R 33/56536; G01R 33/4833; G01R 33/5617
See application file for complete search history.

(56) References Cited

U.S. PATENT DOCUMENTS

| 5,657,757 A | 8/1997 | Hurd et al. |
| 8,334,695 B2 * | 12/2012 | McColl ............ G01R 33/56509 324/307 |
| 9,360,542 B2 * | 6/2016 | Reeder ................. G01R 33/485 |
| 2013/0033263 A1 | 2/2013 | Fautz et al. |
| 2013/0278254 A1 | 10/2013 | Reeder et al. |

OTHER PUBLICATIONS

"SEMAC: Slice Encoding for Metal Artifact Correction in MRI," Lu et al., Magnetic Resonance in Medicine, vol. 62 (2009), pp. 66-76.
"Dynamic Imaging With Multiple Resolutions Along Phase-Encode and Slice-Select Dimensions," Panych et al., Magnetic Resonance in Medicine, vol. 45 (2001), pp. 940-947.

* cited by examiner

*Primary Examiner* — Gregory H Curran
(74) *Attorney, Agent, or Firm* — Schiff Hardin LLP (57) ABSTRACT

In a method and a magnetic resonance system to acquire MR data of a slice of a volume segment within an examination subject, a slice selection gradient is activated along a first direction that is orthogonal to the slice. An RF excitation pulse is radiated for selective excitation of the slice, a first phase coding gradient is activated along the first direction, and a second phase coding gradient is activated along a second direction. The second direction is orthogonal to the first direction. A readout gradient is activated along a third direction that is orthogonal to the first direction and the second direction. MR data are acquired while the readout gradient is activated. A number of phase coding steps for the second phase coding gradient is determined depending on the first phase coding gradient.

10 Claims, 5 Drawing Sheets

METHOD AND MAGNETIC RESONANCE SYSTEM TO ACQUIRE MR DATA OF A SLICE OF A VOLUME SEGMENT WITHIN AN EXAMINATION SUBJECT

BACKGROUND OF THE INVENTION

Field of the Invention

The present invention concerns a method and a magnetic resonance system in order to acquire MR data within a slice of a volume segment within an examination subject, in particular given magnetic field inhomogeneities.

Description of the Prior Art

A SEMAC method can be used in order to suppress metal artifacts in SE (spin echo)-based sequences (for example TSE (turbo spin echo)); see "SEMAC: Slice Encoding for Metal Artifact Correction in MRI", W. Lu et al. Magnetic Resonance In Medicine 62, Pages 66-76, 2009. In a conventional two-dimensional protocol or, respectively, per-slice sampling, an additional coding is thereby implemented in the slice direction. This coding corresponds to a phase coding and is also known as what is called a SEMAC coding. The measurement time thereby increases linearly with the number of additional phase coding steps in the slice selection direction, which are also designated as SEMAC steps. In particular given T2-weighted TSE protocols with a long repetition time TR, the entire measurement time is thereby markedly increased.

For example, a measurement time of 2 minutes and 8 seconds is required to acquire a slice with 256 phase coding steps given a TSE sequence with a turbo factor of 8 and a repetition time TR of 4 seconds. If eight SEMAC steps are used to suppress metal artifacts, the measurement time increases to over 17 minutes, which is clearly too long for clinical protocols.

SUMMARY OF THE INVENTION

An object of the present invention is to shorten the measurement time relative to the prior art, while still suppressing metal artifacts.

A method according to the present invention to acquire MR data of an individual slice of a volume segment within an examination subject by operation of a magnetic resonance system includes the following steps in order to acquire the MR data in the slice:

Switch a slice selection gradient along a first direction or, respectively, slice selection direction which is orthogonal to the slice.

Radiate an RF excitation pulse for selective excitation of the slice while the slice selection gradient is being switched, such that only the spins of the slice are excited.

Switch a first phase coding gradient along the first direction. The switching of this first phase coding gradient can also be designated as a SEMAC coding, such that the first phase coding gradient is in particular used for SEMAC coding.

Switch a second phase coding gradient along a second direction which is orthogonal to the first direction.

Switch a readout gradient along a third direction which is orthogonal to the first direction and second direction.

Read out the MR data while the readout gradient is being switched. In this step, the MR data are read out along a k-space line.

According to the invention, the number of phase coding steps with regard to the second phase coding gradient (i.e. along the second direction) is dependent on the value of the first phase coding gradient, such that the number of phase coding steps is not constant with regard to the phase coding gradient.

In the SEMAC method, the number of phase coding steps along the second direction is independent of the first phase coding gradient. This means that, in the SEMAC method, the number of phase coding steps along the second direction is constant and, for example, is 256.

Because according to the invention, a dependency exists between the number of phase coding steps along the second direction and the value of the first phase coding gradient, the number of phase coding steps along the second direction can be reduced for specific values of the first phase coding gradients, so the measurement time is accordingly reduced.

The method according to the invention is effectively a two-dimensional method since only a slice is acquired, and not a three-dimensional volume which is comprised of multiple slices and thus is to be scanned in the form of multiple slices. In other words: the phase coding in the slice selection direction serves exclusively for the purpose of acquiring all excited spins of the slice, which are shifted in space—in particular in the slice selection direction—due to magnetic field inhomogeneities.

In particular, the number of phase coding steps along the second direction can be dependent on the magnitude of the gradient moment (as the value) of the first phase coding gradient. In particular, the number of phase coding steps along the second direction for a first magnitude of the value of the first phase coding gradient is less than or equal to the number of phase coding steps along the second direction for a second magnitude of the value of the first phase coding gradient, if the first magnitude is greater than the second magnitude.

The greater the magnitude of the gradient moment of the first phase coding gradient, the more distant that MR data in k-space are from the actual slice to be acquired. Without knowledge of the actual magnetic field inhomogeneities, it becomes more unlikely to acquire excited spins the further distant that one is located from the actual slice to be acquired or, respectively, to be excited. Therefore, k-space lines on average have less information the further distant that they are situated from the actual slice to be acquired, which is why the procedure to keep the number of phase coding steps along the second direction smaller the larger the magnitude of the gradient moment of the first phase coding gradient (or to have the number of phase coding steps at least not increase) only leads to a small information loss.

If it is assumed that a predetermined number of phase coding steps along the second direction is required given a homogeneous magnetic field (i.e. without occurrence of magnetic field inhomogeneities) in order to achieve a desired resolution for the slice, the number of phase coding steps along the second direction then advantageously corresponds to this predetermined number if the gradient moment of the first phase coding gradient amounts to zero.

This means that all k-space lines in k-space are acquired if the gradient moment of the first phase coding gradient is zero, or if the first phase coding gradient is not applied. All k-space lines are therefore acquired for that slice which would include all excited spins if no magnetic field inhomogeneities were present.

If the first phase coding gradient has a value of zero, for the gradient moments $GM_i$ of the second phase coding gradient a mean value MW or an average gradient moment can be calculated according to the following Equation (1).

$$MW = \frac{\sum_{i=1}^{N} GM_i}{N} \quad (1)$$

wherein N is the number of phase coding steps with regard to the second phase coding gradient for the case that the first phase coding gradient has a value of zero.

The gradient moments of the second phase coding gradient are now in particular chosen such that they are arranged symmetrically around the mean value MW for all gradient moments of the first phase coding gradient.

This symmetrical arrangement of the gradient moments of the second phase coding gradient means that—independent of the value of the first phase coding gradient—just as many phase coding steps have a lower value than the mean value MW as phase coding steps that have a greater value than the mean value MW.

According to a preferred embodiment according to the invention, two adjacent phase coding steps of the second phase coding gradient have the same interval, independently of the value of the first phase coding gradient.

According to this embodiment, the step width of the phase coding gradients of the second phase coding gradient is constant, wherein this is independent of which value the first phase coding gradient has.

If this embodiment is combined with the variant described above (to arrange the phase coding steps of the second phase coding gradient symmetrically around the mean value MW), this means that k-space lines in the middle region of k-space are preferentially scanned while, the more k-space lines that are not acquired at the edge of k-space, the lower the number of phase coding steps with regard to the second phase coding gradient for the corresponding value of the first phase coding gradient.

According to the invention, the number of phase coding steps with regard to the second phase coding gradient is determined depending on the gradient moment of the first phase coding gradient. The gradient moments of the second phase coding gradient thereby have a minimum gradient moment and a maximum gradient moment which are both chosen depending on the value of the first phase coding gradient. In particular, the lower the number of phase coding steps with regard to the second phase coding gradient, the smaller the spacing between the maximum gradient moment and the minimum gradient moment.

According to the variant according to the invention that is described in the preceding, the lower the number of phase coding steps with regard to the second phase coding gradient, the smaller the spacing between the first and last phase coding step with regard to the second phase coding gradient.

If a reconstruction (for example to create an MR image) is implemented depending on the acquired MR data, in particular those MR data which do not correspond to implemented phase coding steps of the second phase coding gradients are populated with a value of 0.

In other words, a technique known as a zero filling is implemented, which means that the k-space lines that are not read out are filled with zeroes for reconstruction.

For selective excitation of the slice, in addition to the RF excitation pulse an RF refocusing pulse can be radiated while an additional slice selection gradient is being switched. This RF refocusing pulse is radiated chronologically after the RF excitation pulse and—together with the additional slice selection gradient—serves to refocus only the spins of the slice. According to the invention, after an RF excitation pulse multiple RF refocusing pulses can also be radiated in chronological succession while the respective additional slice selection gradient is being switched, in order to refocus only the spins of the slice.

The method according to the invention can be based both on a gradient echo method and on a spin echo method, wherein a spin echo method is preferred.

Within the scope of the present invention, a magnetic resonance system is also provided for acquisition of MR data of a slice of a volume segment within an examination subject. The magnetic resonance system has a basic field magnet, a gradient field system, one or more RF antennas, and a control device to operate the gradient field system and the RF antenna(s), to receive the measurement signals that are acquired by the RF antenna(s), and to evaluate the measurement signals and create the MR data. The magnetic resonance system is designed so that the control device activates a slice selection gradient along a first direction (which is orthogonal to the slice) with the use of the gradient field system, and such that an RF excitation pulse is radiated with the one or more RF antennas for selective excitation of the slice. Moreover, the gradient field system is operated to activate a first phase coding gradient along the first direction and a second phase coding gradient along a second direction which is orthogonal to the first direction. The gradient field system is also operated to activate a readout gradient along a third direction that is orthogonal to the first direction and the second direction in order to acquire MR data with the RF antenna or antennas while the readout gradient is being activated. The control device determines a number of phase coding steps along the second direction depending on the gradient moment of the first phase coding gradient.

The advantages of the magnetic resonance system according to the invention essentially correspond to the advantages of the method according to the invention as described above.

The present invention also encompasses a non-transitory, computer-readable data storage medium encoded with programming instructions that, when loaded into a computer or control unit of a magnetic resonance imaging system, causes the computer or control unit to operate the magnetic resonance system according to any or all of the embodiment of the method described above. The programming instructions can be in source code (C++, for example) that must still be compiled (translated) and linked or that only must be interpreted, or can be an executable software code that has only to be loaded into the corresponding computer or control device for execution.

The electronically readable data medium can be, for example, a DVD, a magnetic tape or a USB stick. All embodiments according to the invention of the method described above can be implemented wherein the control information is read from the data medium and stored in a control device or computer of a magnetic resonance system.

The present invention is particularly suitable for acquisition of MR data within a volume segment in which, or in proximity to which, a metallic implant is located. The present invention is naturally not limited to this preferred field of application since the present invention can generally be used given magnetic field inhomogeneities.

DESCRIPTION OF THE PREFERRED EMBODIMENTS

Figure 1:
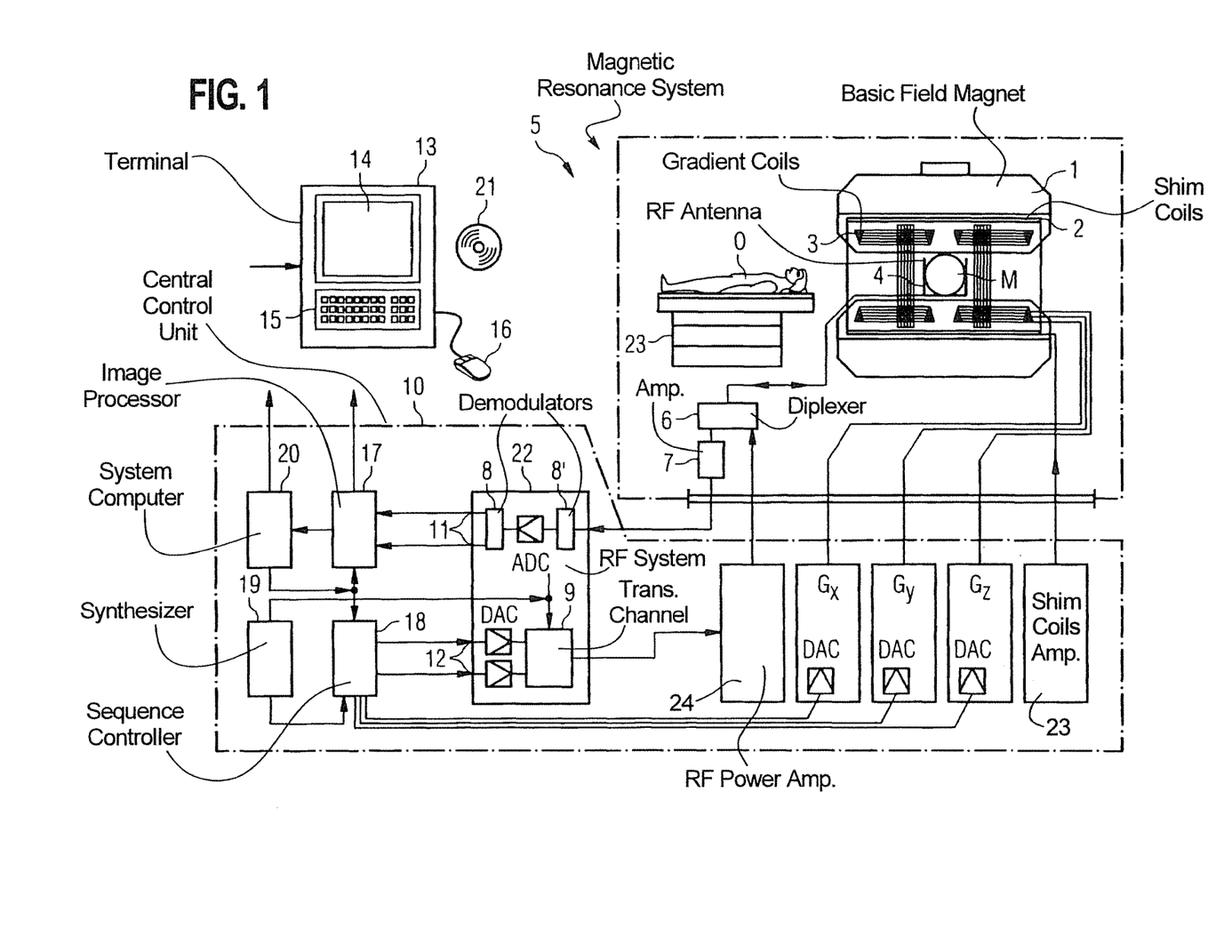
FIG. 1 shows a magnetic resonance system according to the invention.

FIG. 1 is a schematic depiction of a magnetic resonance system 5 (a magnetic resonance imaging or magnetic resonance tomography apparatus). A basic field magnet 1 generates a temporally constant, strong magnetic field for polarization or alignment of the nuclear spins in a volume segment of a subject O, for example of a part of a human body that is to be examined. The body is examined in the magnetic resonance system 5 while lying on a table 23. The high homogeneity of the basic magnetic field that is required for the nuclear magnetic resonance measurement is defined in a typically spherical measurement volume M into which the parts of the human body that are to be examined are arranged, wherein this homogeneity can be disrupted by metallic articles. Shim plates made of ferromagnetic material are attached at suitable points to support the homogeneity requirements, and in particular to eliminate temporally invariable influences. Temporally variable influences are eliminated by shim coils 2, operate by a shim coils amplifier 23.

A cylindrical gradient field system 3 composed of three sub-windings is used in the basic field magnet 1. Each sub-winding is supplied with current by an amplifier to generate a linear (also temporally variable) gradient field in the respective direction of the Cartesian coordinate system. The first sub-winding of the gradient field system 3 generates a gradient $G_x$ in the x-direction; the second sub-winding generates a gradient $G_y$ in the y-direction; and the third sub-winding generates a gradient $G_z$ in the z-direction. Each amplifier has a digital/analog converter that is controlled by a sequence controller 18 for accurately-timed generation of gradient pulses.

Within the gradient field system 3 are one or more radio-frequency antennas 4 that convert the radio-frequency pulses emitted by a radio-frequency power amplifier into an alternating magnetic field for excitation of the nuclei and alignment of the nuclear spins of the subject O to be examined, or of the region of the subject O that is to be examined. Each radio-frequency antenna 4 is composed of one or more RF transmission coils and one or more RF reception coils in the form of an annular (preferably linear or matrix-like) arrangement of component coils. The alternating field emanating from the precessing nuclear spins—normally the nuclear spin echo signals caused by a pulse sequence composed of one or more radio-frequency pulses and one or more gradient pulses—is converted by the RF reception coils of the respective radio-frequency antenna 4 into a voltage (measurement signal) which is supplied via an amplifier 7 to a radio-frequency reception channel 8 of a radio-frequency system 22. The radio-frequency system 22 (which is part of a control device 10 of the magnetic resonance system 5) furthermore has a transmission channel 9 in which the radio-frequency pulses are generated for the excitation of the nuclear magnetic resonance. The respective radio-frequency pulses are digitally represented in the sequence controller 18 as a series of complex numbers based on a pulse sequence predetermined by the system computer 20. This number sequence is supplied as a real part and imaginary part to a digital/analog converter in the radio-frequency system 22 via respective inputs 12, and the said digital/analog converter to a transmission channel 9. In the transmission channel 9, the pulse sequences are modulated on a radio-frequency carrier signal whose base frequency corresponds to the center frequency, and are supplied to the radio-frequency antenna 4 from an RF power amplifier 24.

The switching from transmission operation to reception operation takes place via a transmission/reception diplexer 6. The RF transmission coils of the radio-frequency antenna(s) 4 radiate(s) the radio-frequency pulses for excitation of the nuclear spins into the measurement volume M, and resulting echo signals are scanned via the RF reception coil(s). The acquired nuclear magnetic resonance signals are phase-sensitively demodulated to an intermediate frequency in a first reception channel 8' (first demodulator) of the radio-frequency system 22, digitized in an analog/digital converter (ADC) and output via the output 11. This signal is further demodulated to a frequency of 0. The demodulation to a frequency of 0 and the separation into real part and imaginary part occurs in a second demodulator 8 after the digitization in the digital domain. An MR image or three-dimensional image data set is reconstructed by an image computer 17 from the measurement data acquired in such a manner. The administration of the measurement data, the image data and the control programs takes place via the system computer 20. Based on a specification with control programs, the sequence controller 18 monitors the generation of the respective desired pulse sequences and the corresponding scanning of (entry of data into) k-space. In particular, the sequence controller 18 controls the accurately-timed switching of the gradients, the emission of the radio-frequency pulses with defined phase amplitude and the reception of the nuclear magnetic resonance signals. The time base for the radio-frequency system 22 and the sequence controller 18 is provided by a synthesizer 19. The selection of corresponding control programs to generate an MR image (which is stored on a DVD 21, for example) and the presentation of the generated MR image take place via a terminal 13 which comprises a keyboard 15, a mouse 16 and a monitor 14.

Figure 2:
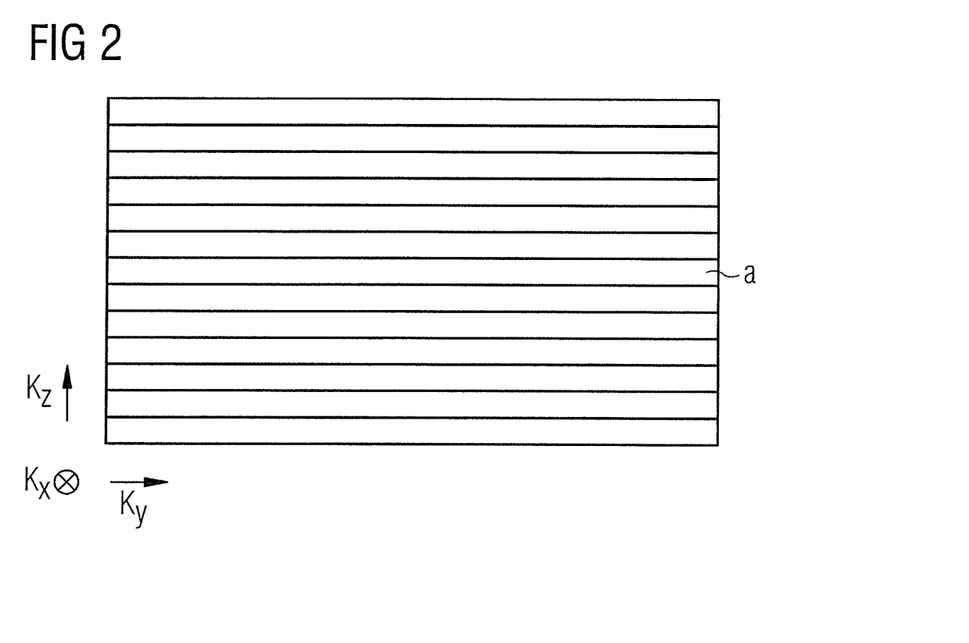
FIG. 2 illustrates the entry of data into k-space according to the SEMAC method.

The scanning of k-space according to the SEMAC method is shown in FIG. 2.

The goal is optimally to acquire all spins which are excited by a selective excitation of the slice a. Due to magnetic field inhomogeneities, the spins excited by the selective excitation lie in a volume segment which is at least partially disturbed and shifted relative to the slice a. For this reason, according to the SEMAC method slices adjacent to the slice a are also scanned in k-space or are spatially resolved, as is shown in FIG. 2.

Each shown slice in FIG. 2 corresponds to a defined phase coding step in the slice selection direction $K_z$, i.e. to a defined gradient moment with regard to a first phase coding gradient which acts in the $K_z$ direction. In order to acquire the MR data of a slice, a defined number of phase coding steps are necessary along a second direction $K_y$. For each of these phase coding steps, a k-space line is read out in a third direction $K_x$. The first direction $K_z$ (or, respectively, slice selection direction), the second direction $K_y$ and the third direction $K_z$ are thereby mutually orthogonal to one another.

It can be seen in FIG. 2 that each slice is read out completely. This means that the number of phase coding steps along the second direction $K_y$ is constant, and therefore independent of the first phase coding gradient or, respectively, independent of the value or gradient moment of the first phase coding gradient.

Figure 3:
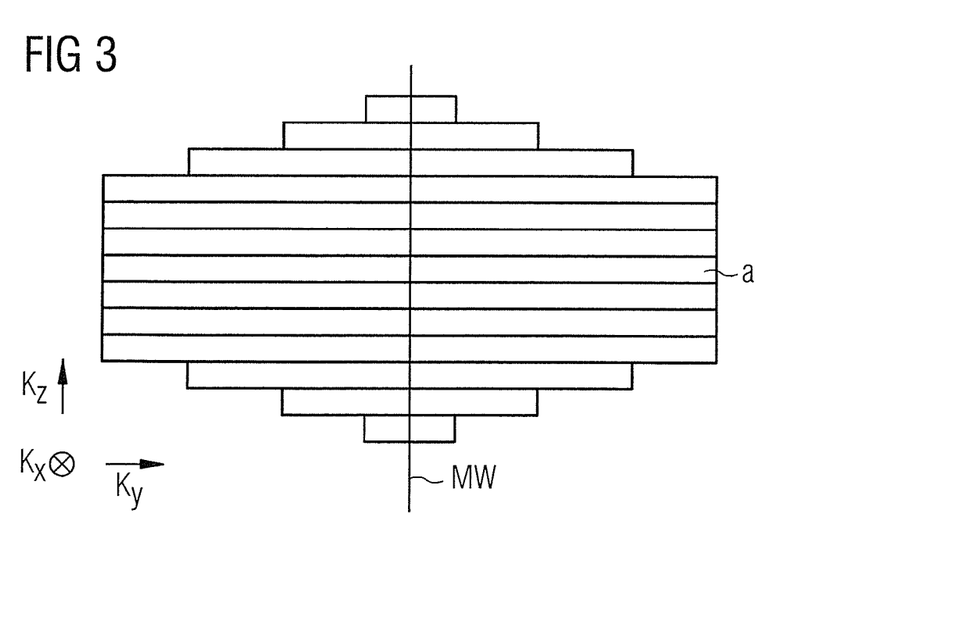
FIG. 3 illustrates the entry of data into k-space according to the present invention, in comparison to FIG. 2.

In contrast to this, in FIG. 3 (in which the present invention is shown) the number of phase coding steps along the second direction $K_y$ depends on the value of the first phase coding gradient. While the slice a and the three slices adjacent to slice a to the top and bottom (in FIG. 3) are scanned completely, the slices which has [sic] an even greater distance upward or downward are no longer scanned completely.

The gradient moment of the first phase coding gradient has a value of zero for acquisition of the slice a. To acquire the slices above the slice a, the gradient moment rises linearly with the distance from slice a, while the gradient moment falls linearly with the distance from slice a to acquire the slices below the slice a. Each slice is accordingly defined by the value of the gradient moment of the first phase coding gradient. It is thereby the case that—for a slice in which the gradient moment of the first phase coding gradient has a first absolute value—the number of phase coding steps along the second direction $K_y$ is less than or the same in comparison to a slice in which the gradient moment of the first phase coding gradient has a second absolute value which is greater than the first absolute value.

Moreover, the phase coding steps along the second direction $K_y$ are arranged symmetrically relative to a mean value MW for all slices or for all values of the first phase coding gradient. This mean value corresponds in each slice (for each value of the first phase coding gradient) to the mean value of the gradient moments of the second phase coding gradient for this slice.

Because the phase coding steps along the second direction $K_y$ are arranged symmetrically relative to the meal value MW, k-space lines along the third direction are scanned in the middle region of k-space, while the k-space lines in the corners of k-space are not acquired (as can be learned from FIG. 3). If the contour or border around the scanned k-space lines along the third direction $K_x$ that is shown in FIG. 3 is considered, a kind of ellipse results.

It can be seen in FIG. 3 that, for the lowermost four and the uppermost four slices, the distance between the minimum value and the maximum value of the gradient moment of the second phase coding gradient is smaller the smaller the number of phase coding steps with regard to the second phase coding gradient or, respectively, the smaller the number of k-space lines acquired in the respective slice.

Figure 4:
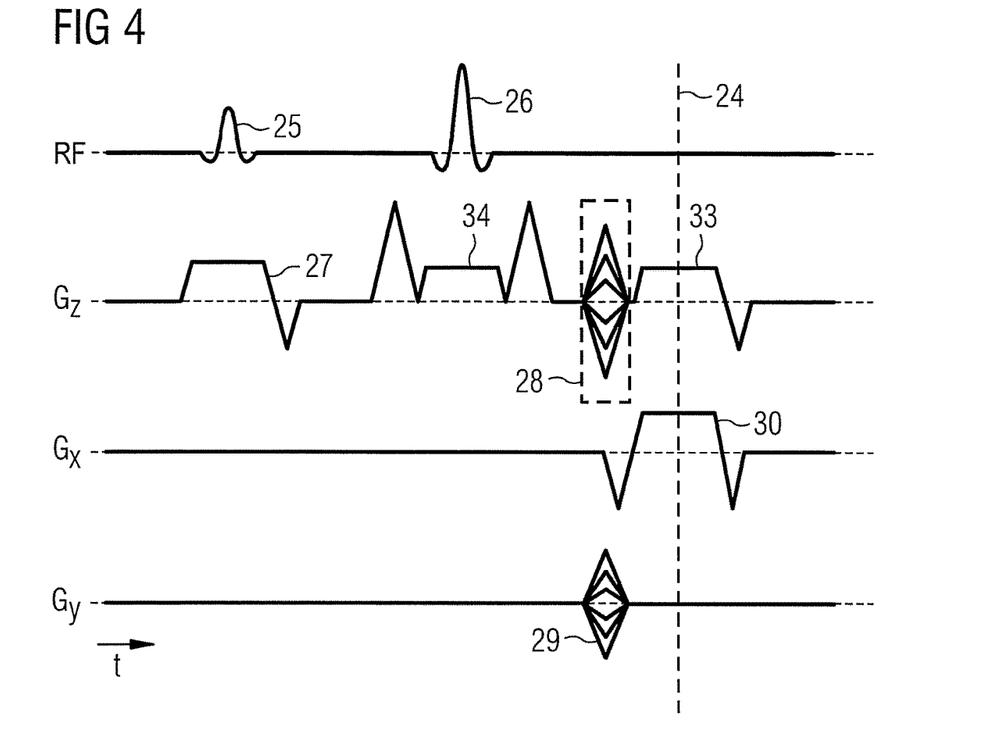
FIG. 4 shows a first variant of a sequence according to the invention, which is based on a spin echo sequence.

A spin echo sequence according to the invention for scanning k-space is shown in FIG. 4. The slice a is excited by an RF pulse 25 while a gradient 27 is switched in the slice selection direction $K_z$. A refocusing pulse 26 is subsequently switched while an additional gradient 34 is being switched in the slice selection direction $K_z$, such that only the spins in the slice a are refocused. Phase coding subsequently takes place with the first phase coding gradient 28 and the second phase coding gradient 29, before a k-space line along the third direction $K_x$ is read out given switched readout gradient 30. The gradient 33 switched during the readout serves for VAT (view angle tilting) compensation as it is described in the aforementioned SEMAC publication. The spin echo 24 occurs in the middle of the readout.

Figure 5:
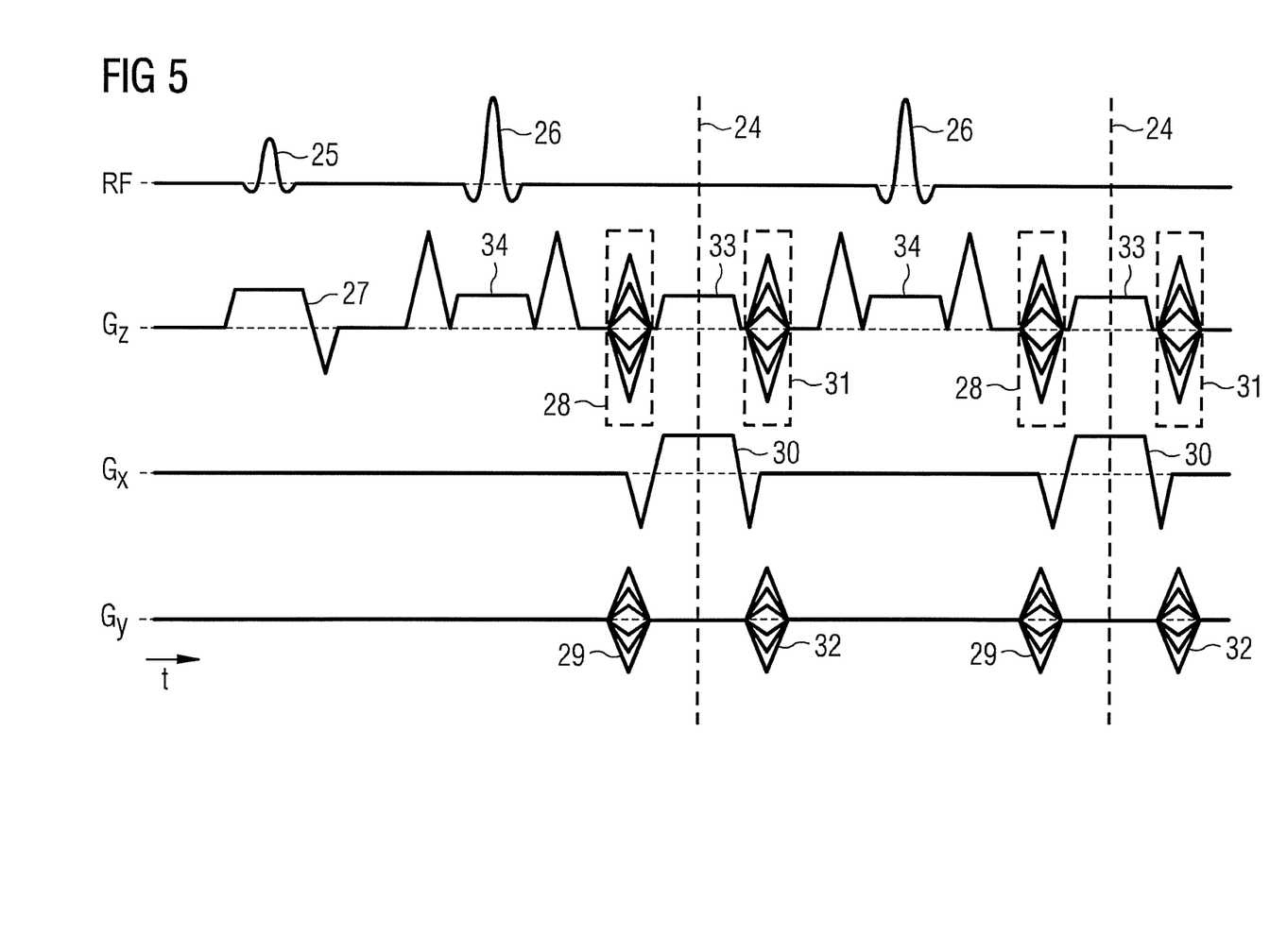
FIG. 5 shows a second variant of a sequence according to the invention, which is based on a turbo spin echo sequence.

A variant of the spin echo sequence shown in FIG. 4 is presented in FIG. 5, with which variant multiple k-space lines are read out based on one RF excitation pulse 25. Up to (including) the readout of the first k-space line, the sequence shown in FIG. 5 corresponds to the sequence shown in FIG. 4. A gradient 31 in the slice selection direction $K_x$ and a gradient 32 along the second direction $K_y$ are switched subsequently (i.e. after the readout) in order to compensate for the effects of the first phase coding gradient 28 and the second phase coding gradient 29. Therefore, the curve of the gradient 31 corresponds to the curve of the first phase coding gradient 28, mirrored on the time axis t, and the curve of the gradient 32 corresponds to the curve of the second phase coding gradient 29, mirrored on the time axis t.

After the gradients 31, 32, an additional refocusing pulse 26 is switched while an additional gradient 34 is being applied in the slice selection direction $K_x$ in order to in turn refocus only the spins of the slice. After this, an additional phase coding occurs with the first phase coding gradient 28 and the second phase coding gradient 29 in order to read out an additional k-space line in the third direction $K_x$, which in turn takes place given a switched readout gradient 30 and given a switched VAT compensation gradient. Over 100 k-space lines can be read out based on one RF excitation pulse 25 in the manner shown in FIG. 4.

Figure 6:
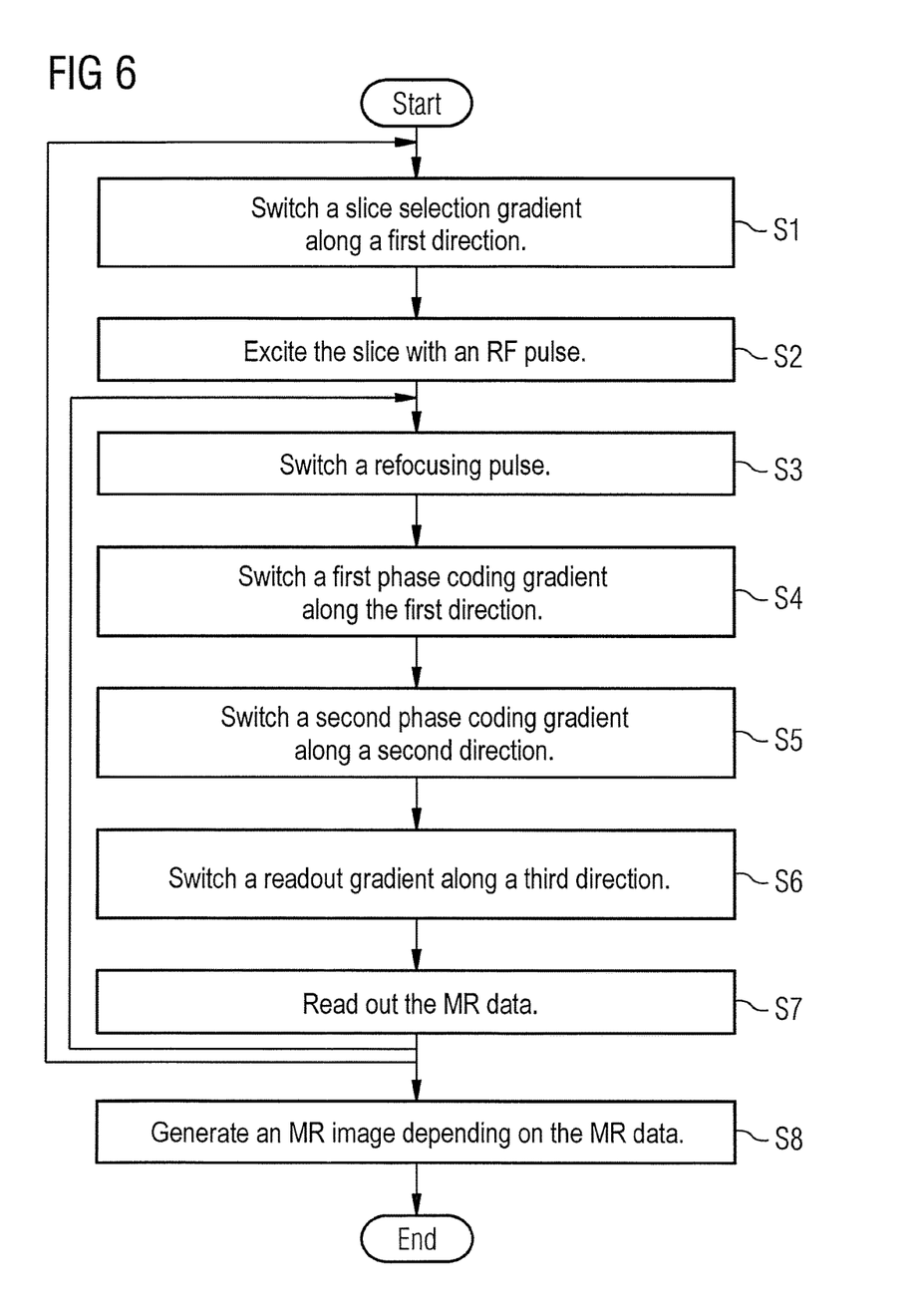
FIG. 6 is a flowchart of an embodiment of the method according to the invention.

The method according to the invention is shown in FIG. 6 in the form of a flow chart.

The slice selection gradient 27 is switched in step S1, while in step S2 the slice a is excited with an RF excitation pulse 25. In the following step S3, the refocusing pulse 26 is switched before the first phase coding gradient 28 along the slice selection direction K—and the second phase coding gradient 29 along the second direction $K_y$ are switched in steps S4 and S5. The readout of the MR data subsequently takes place in step S7 while the readout gradient 30 is being switched in step S6. Steps S3 through S7 can be repeated multiple times.

If all planned k-space lines have not yet been read out, the method according to the invention jumps back to step S1, in which the sequence shown in FIG. 5 is implemented again. If all planned k-space lines have been read out, in step S8 an MR image is reconstructed depending on the acquired MR data.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to acquire magnetic resonance (MR) data of a slice of a volume segment within an examination subject, comprising:

operating a gradient system of an MR data acquisition unit, in which an examination subject is situated, to activate a slice selection gradient along a first direction that selects a slice, orthogonal to the first direction, in the examination subject;

operating a radio-frequency (RF) system of the MR data acquisition unit to radiate an RF excitation pulse that excites nuclear spins only in said slice;

operating the gradient system to activate a first phase coding gradient that phase encodes, along said first direction, MR signals produced by the excited nuclear spins;

operating the gradient system to activate a second phase coding gradient, along a second direction that is orthogonal to said first direction, that encodes said MR signals in said second direction in a number of phase coding steps, said number being dependent on said first phase coding gradient;

operating said gradient system to activate a readout gradient along a third direction that is orthogonal to said first direction and to said second direction to acquire said MR signals; and entering MR data corresponding to the MR signals into an electronic memory organized as k-space according to the phase coding produced by said first phase coding gradient and the phase coding produced by said second phase coding gradient, thereby producing a data file in said memory that is available in electronic form for further processing of said MR data.

2. A method as claimed in claim 1 comprising operating said gradient system to give said first phase coding gradient a gradient moment having an absolute value, and operating said gradient system to give said second phase coding gradient said number of phase coding steps when the gradient moment of the first phase coding gradient has a first absolute value that is greater than or equal to said number of phase coding steps of said second phase coding gradient when said gradient moment of said first phase coding gradient has a second absolute value that is greater than said first absolute value.

3. A method as claimed in claim 1 comprising:
operating said MR data acquisition unit to generate a homogeneous basic magnetic field in an imaging volume in which said slice is situated and wherein there is a predetermined number of phase coding steps of said second phase coding gradient that is required in order to acquire all MR data of said slice in said homogenous magnetic field;
operating said gradient system to give said first phase coding gradient a gradient moment of zero; and
operating said gradient system to give said second phase coding gradient said number of phase coding steps that is equal to said predetermined number.

4. A method as claimed in claim 1 comprising:
operating said gradient system to give said first phase coding gradient a gradient moment of zero, and wherein said number of phase coding steps of said second phase coding gradient have an average gradient moment; and
operating said gradient system to cause said phase coding steps of said second phase coding gradient to be symmetrically arranged in said electronic memory around said average gradient moment for all phase coding steps of said first phase coding gradient.

5. A method as claimed in claim 4 comprising operating said gradient system to cause two adjacent phase coding steps of said second phase coding gradient to have a same spacing with regard to said gradient moment for all of said phase coding steps of said first phase coding gradient.

6. A method as claimed in claim 1 comprising:
operating said gradient system to give said phase coding steps of said second phase coding gradient a maximum and a minimum gradient moment dependent on a gradient moment of said first phase coding gradient; and
operating said gradient system to make a spacing between said minimum and maximum gradient moments smaller as the number of phase coding steps of said second phase coding gradient becomes smaller.

7. A method as claimed in claim 1 comprising:
in said further processing of said MR data from said electronic memory, reconstructing an image of said slice in a computer having access to said electronic memory by executing an image reconstruction algorithm in said computer; and in said image reconstruction algorithm, assigning data entry locations in said electronic memory, which are not filled with data by said phase coding steps of said second phase coding gradient, a value of zero.

8. A method as claimed in claim 1 comprising:
operating said RF system, after radiating said RF excitation pulse, to radiate an RF refocusing pulse while operating said gradient system to activate an additional slice selection gradient along said first direction.

9. A magnetic resonance (MR) apparatus comprising:
an MR data acquisition unit, which an examination subject is situated said MR data acquisition unit comprising a gradient system and a radio-frequency system;
a control computer configured to operate a gradient system of the MR data acquisition unit to activate a slice selection gradient along a first direction that selects a slice orthogonal to said first direction, in the examination subject;
said control computer being configured to operate the RF system of the MR data acquisition unit to radiate an RF excitation pulse that excites nuclear spins only in said slice;
said control computer being configured to operate the gradient system to activate a first phase coding gradient that phase encodes, along said first direction, MR signals produced by the excited nuclear spins;
said control computer being configured to operate the gradient system to activate a second phase coding gradient, along a second direction that is orthogonal to said first direction, that encodes said MR signals in said second direction in a number of phase coding steps, said number being dependent on said first phase coding gradient;
said control computer being configured to operate said gradient system to activate a readout gradient along a third direction that is orthogonal to said first direction and to said second direction to acquire said MR signals;
an electronic memory organized as k-space; and
said control computer being configured to enter MR data corresponding to the MR signals into said electronic memory organized as k-space according to the phase coding produced by said first phase coding gradient and the phase coding produced by said second phase coding gradient, thereby producing a data file in said memory that is available in electronic form for further processing of said MR data.

10. A non-transitory, computer-readable data storage medium encoded with programming instructions, said data storage medium being loaded into a control and processing computer system of a magnetic resonance (MR) apparatus, said MR apparatus comprising an MR data acquisition unit, in which an examination subject is situated, having a gradient system and a radio-frequency (RF) system, said programming instructions causing said processing and control computer to:
operate the gradient system of the MR data acquisition unit to activate a slice selection gradient along a first direction that selects a slice, orthogonal to said first direction, in the examination subject;
operate the RF system of the MR data acquisition unit to radiate an RF excitation pulse that excites nuclear spins only in said slice;
operate the gradient system to activate a first phase coding gradient that phase encodes, along said first direction, MR signals produced by the excited nuclear spins;
operate the gradient system to activate a second phase coding gradient, along a second direction that is orthogonal to said first direction, that encodes said MR signals in said second direction in a number of phase coding steps, said number being dependent on said first phase coding gradient;

operate said gradient system to activate a readout gradient along a third direction that is orthogonal to said first direction and to said second direction to acquire said MR signals; and enter MR data corresponding to the MR signals into an electronic memory organized as k-space according to the phase coding produced by said first phase coding gradient and the phase coding produced by said second phase coding gradient, thereby producing a data file in said memory that is available in electronic form for further processing of said MR data.

* * * * *